(12) United States Patent
Lee

(10) Patent No.: US 6,437,406 B1
(45) Date of Patent: Aug. 20, 2002

(54) SUPER-HALO FORMATION IN FETS

(75) Inventor: Kam-Leung Lee, Putnam Valley, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/692,093

(22) Filed: Oct. 19, 2000

(51) Int. Cl.[7] .......................... H01L 27/01; H01L 27/12; H01L 21/265; H01L 21/425
(52) U.S. Cl. .................. 257/349; 257/346; 438/520; 438/525
(58) Field of Search ................. 438/520, 525; 257/336, 349

(56) References Cited

U.S. PATENT DOCUMENTS

| | | | |
|---|---|---|---|
| 5,320,974 A | 6/1994 | Hori et al. | 437/44 |
| 6,008,099 A | * 12/1999 | Sultan et al. | 438/305 |
| 6,221,724 B1 | * 4/2001 | Yu et al. | 438/289 |
| 6,268,640 B1 | * 7/2001 | Park et al. | 257/607 |
| 6,281,532 B1 | * 8/2001 | Doyle et al. | 257/288 |

OTHER PUBLICATIONS

High Carrier Velocity Reliability of Quarter–Micron SPI (Self–aligned Pocket Implantation)MOSFETs, 28.3.1–28.3.4 (4 pages).

A 0.1—$\mu$m CMOS Technology with Tilt–Implanted Punch-through Stopper (TIPS), 4.3.14.3.4 (4 pages).

1997 55th Annual Device Research Conference Digest, (3 pages).

Halo Doping Effects In Submicron DI–LDD Device Design, (4 pages).

CMOS Devices below 0.1 $\mu$m: How High Will Performance Go?, (4 pages).

* cited by examiner

Primary Examiner—Trung Dang
Assistant Examiner—William M. Brewster
(74) Attorney, Agent, or Firm—Casey P. August; Perman & Green, LLP

(57) ABSTRACT

A semiconductor substrate has at least one PN junction with dopant atoms at the junction. A non-dopant at the junction provides interstitial traps to prevent diffusion during annealing. In a process for making this, a non-dopant diffusion barrier, e.g., C, N, Si, F, etc., is implanted into the "halo" region of a semiconductor device, e.g. diode, bipolar transistor, or CMOSFET. This combined with a lower annealing budget ("Spike Annealing") allows a steeper halo dopant profile to be generated. The invention is especially useful in CMOSFETs with gate lengths less than about 50 nm.

10 Claims, 2 Drawing Sheets

SUPER-HALO FORMATION IN FETS

CROSS-REFERENCES TO RELATED APPLICATIONS

Figure 1:
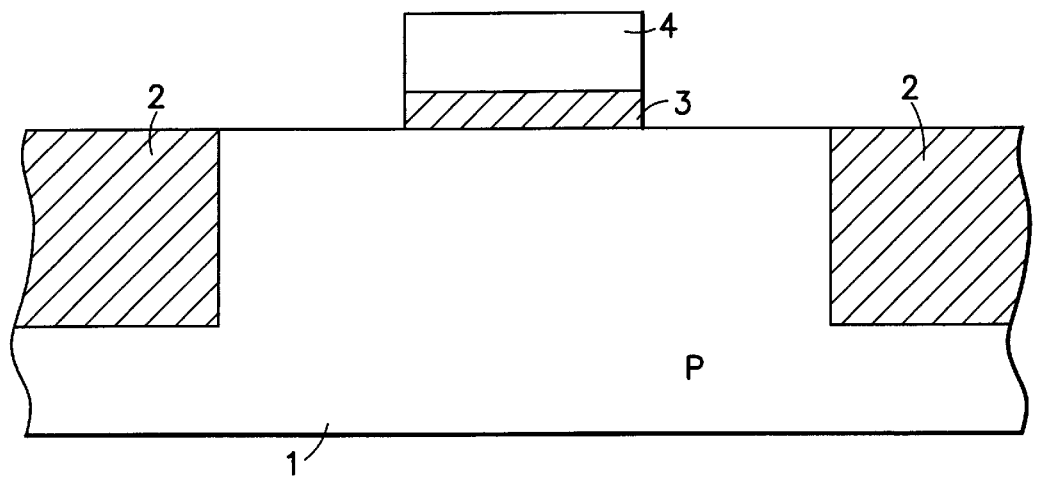

This application is related to application Ser. No. 09/736,877, titled "Sacrificial Polysilicon Sidewall process and rapid thermal spike annealing for advance CMOS fabrication", by K. Lee, Y. Zhang, hereby incorporated by reference.

STATEMENT REGARDING FEDERALLY SPONSORED RESEARCH OR DEVELOPMENT

Not Applicable

BACKGROUND OF THE INVENTION

1. Field of the Invention

The present invention relates to FETs (Field Effect Transistors), and more particularly to those with short, e.g., less than 50 nm, gate length.

2. Description of the Related Art Including Information Disclosed Under 37 CFR 1.97 AND 1.98

As CMOS technology becomes smaller, e.g., less than 50 nm gate length, it becomes more and more difficult to improve the short channel device performance and at the same time maintain acceptable values for off-state leakage current.

One technique for trying to achieve this is the halo technique wherein extra dopant implant regions are next to the source and drain extension regions. For this to work the junctions must be abrupt, see "CMOS Devices below 0.1 nm: How High Will Performance Go?", by Y. Taur, et al., pp. 1–4. In particular, for sub 50 nm devices, not only the extension regions near the channel must be abrupt, i.e., less than 4 nm/decade, but the halo profile in proximity to the extension junction must be abrupt, i.e., less than 20 nm/decade. Most of the prior art for the halo formation used a general approach wherein halo dopants are implanted at an angle ranging from 0° to 70° into the channel region. This prior art varied either the dose, halo dopants, or angle of halo implants for improving the device performance. The article "Halo Doping Effects in Submicron DI-LDD Device Design" by Christopher Codella et al. pp. 230–233 describes the optimum halo doses for improving the threshold voltage and the punch-through device characteristics. Punch-through stoppers was also discussed in the U.S. Pat. No. 5,320,974 by Atsushi Hori et al. which is similar to the conventional halo arrangements. The article "A 0.1 nm IHLATI (Indium Halo by Large Angle Tilt Implant) MOSFET for 1.0V Low Power Application" by Young Jin Choi et al. described the use of indium halo and large angle tilt for indium halo implants for improving the short channel characteristics. Other articles are "High Carrier Velocity and Reliability of Quarter-Micron SPI (Self-Aligned Pocket Implantation) MOSEFETs" by A. Hori et al. and "A 0.1-$\mu$m CMOS Technology with Tilt-Implanted Punchthrough Stopper (TIPS)" by T. Hori. None of the prior art focussed attention on improving the abruptness of the halo dopant profiles in the area next to the channel. In these prior art situations, the halo dopants would have suffered enhanced transient diffusion during extension junction and high thermal budget deep source/dran rapid thermal anneal (typically 1000° C. for 5 seconds). Consequently, these much degraded halos severely compromised their usefulness for improving the short channel device characteristics, and this is especially the case for device channel width below 50 nm.

Thus all the prior art approaches provide no means to minimize transient enhanced diffusion of the halo dopants and hence cannot be used to create the abrupt super-halo (<20 nm/decade) in the region next to the channel area.

It is therefore desirable to have an abrupt junction even after annealing.

BRIEF SUMMARY OF THE INVENTION

An apparatus comprises a semiconductor substrate comprising at least one PN junction, dopant atoms disposed within said semiconductor substrate at said PN junction, and a diffusion barrier disposed adjacent at said PN junction.

A process comprises forming a semiconductor PN junction with dopant atoms thereat and forming a diffusion barrier adjacent at said junction.

BRIEF DESCRIPTION OF THE SEVERAL VIEWS OF THE DRAWING(S)

Figure 2:
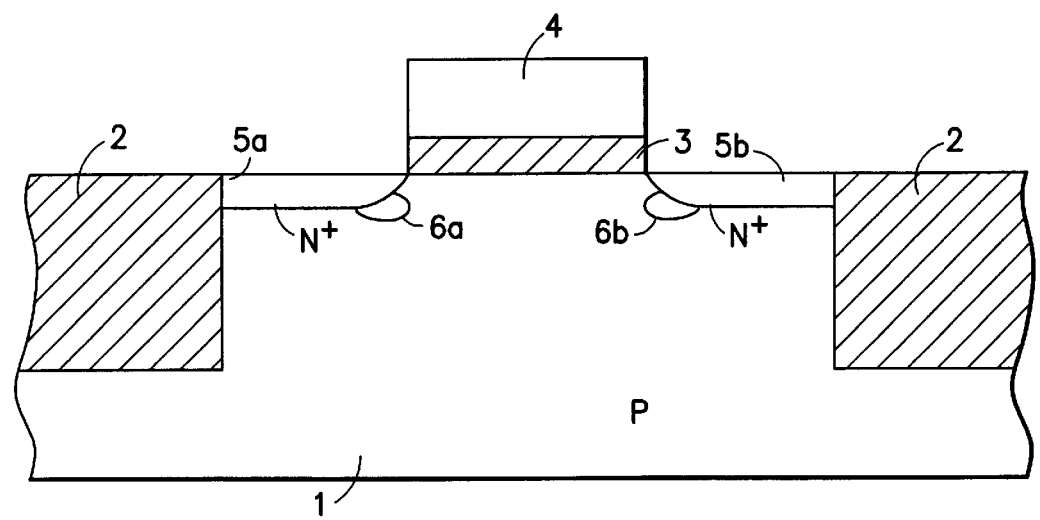
Figure 3:
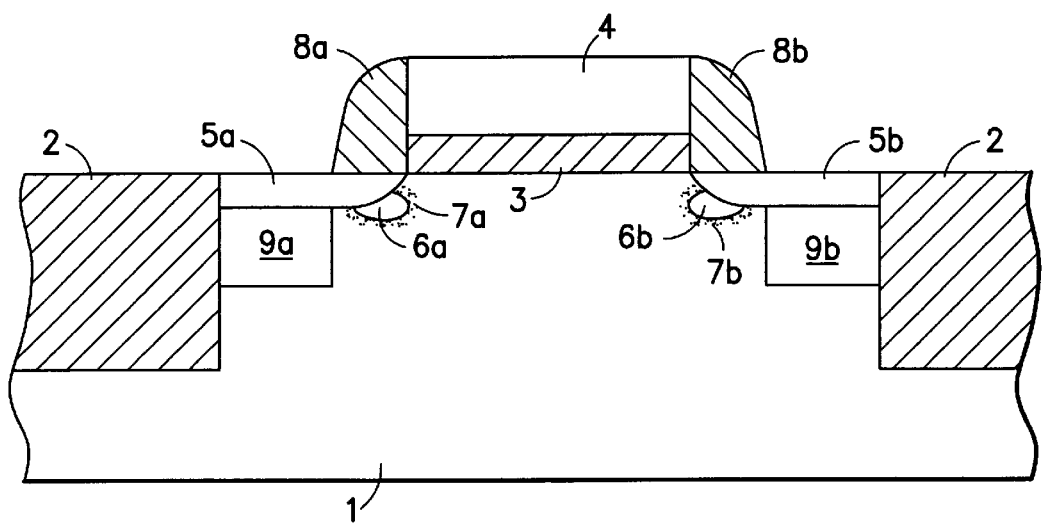
Figure 4:
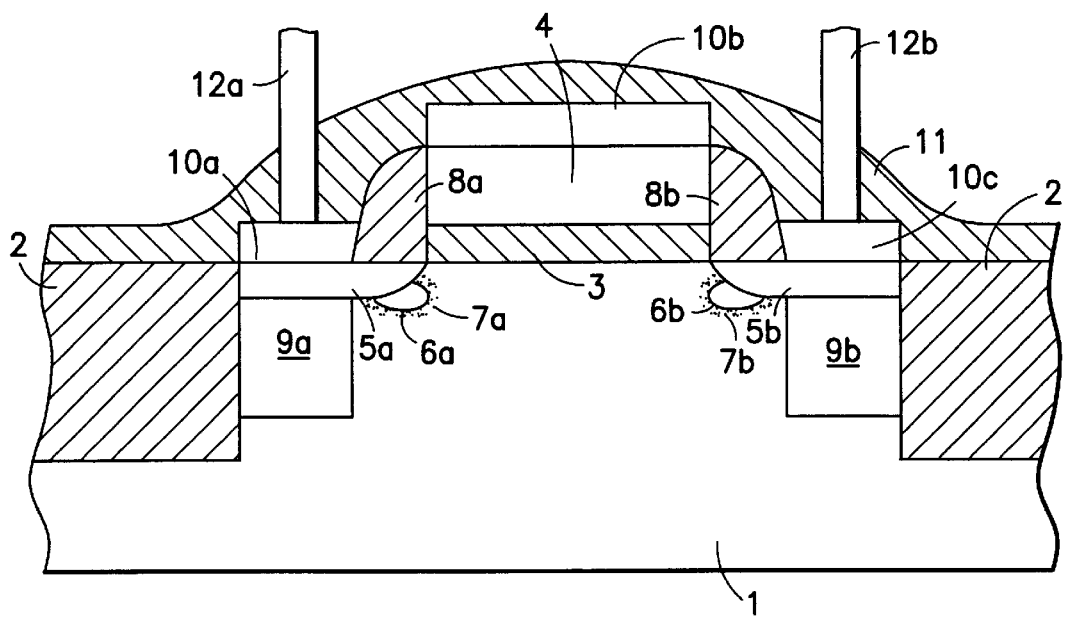

FIGS. 1–3 are cross-sectional views of the process steps to make the invention; and FIG. 4 shows the finished device.

DETAILED DESCRIPTION OF THE INVENTION

As shown in FIG. 1, silicon oxide 2 with a thickness of between about 500 to 1000 nm as an insulating film for separating elements is formed in an element separation trench region of a P-type single crystal silicon semiconductor substrate 1. Another silicon oxide film with a thickness of between about 1 to 3 nm as a gate insulating film is formed on an active region of the substrate 1. Then it is etched using known techniques to form the gate insulating layer 3. Then, after depositing a polycrystalline silicon (p-Si) film with a thickness of between about 100 to 150 nm on these silicon oxide films 2 and 3, a gate electrode 4 with a thickness of about 150 nm is formed by etching the deposited polycrystalline silicon film in ordinary photolithography and etching processes. As shown in FIG. 2, arsenic (As) ions then are implanted at a dose of 1 to $4\times10^{15}$ $cm^{-2}$ at an energy of between about 2 to 10 KeV using the gate electrode 4 as a mask, thereby forming an $N^+$-type source extension region 5a and an $N^+$-type drain extension region 5b.

Then boron (B) is implanted at an energy of between about 3 to 10 KeV at a tilt angle between about 10 to 30 degrees with respect to a normal line of a main surface of substrate 1 and with four rotations around the normal axis and with a total areal dosage of between about $5\times10^{13}/cm^2$ to $5\times10^{14}/cm^2$ to form halo regions 6a & 6b. The condition of the ion implantation for forming the $P^+$-type halo regions 6a and 6b may be adjusted depending upon various factors such as an impurity concentration of the substrate 1, a desired value of the inversion threshold voltage, a minimum gate length and a drain structure. A dosage and a tilt angle of the ion implantation can be selected from a wide range. Boron fluoride ions ($BF_2^+$) and indium ($In^+$) ions are appropriate besides boron ions. Further the shape of halo regions 6 can be other than that shown as known in the art.

In accordance with the invention as shown in FIG. 3, Si interstitial trap diffusion barrier regions 7a and 7b are respectively implanted adjacent halo regions 6a and 6b and comprise a non-dopant, e.g., C, N, Si, F, etc., with a areal density of between about $1\times10^{13}/cm^2$ to about $1\times10^{14}/cm^2$. This can be done by implanting the non-dopant at an angle between about 10° and 30° with respect to the normal to the substrate at an energy between about 5 to 20 KeV, preferably about 13 KeV. Thereafter a spike annealing, e.g., a ramp up rate of greater than about 100° C./s, a hold time of about zero seconds at a target temperature between about 800 to 1050° C., and a ramp down rate greater than about 50° c/s, is performed thus activating the dopants in the extensions 5 and haloes 6. However, other types of annealing can be used.

Spike annealing can be done by high powered tungsten (W) lamps, arc lamps, or excimer laser operating in the non-melting mode, e.g. less than 0.75 J/cm$^2$. During this annealing, trap regions 7a and 7b act as interstitial traps to minimize transient enhanced diffusion of the halo dopants, thereby resulting in abrupt halo doping profiles ("super-halo"). Further, spike annealing has two advantages. One is that the wafer can get up to the high target temperature quickly so that the defect annealing with a higher activation energy (~5 eV) can be carried out with less time spent for undesirable halo dopant with less activation energy (<4 eV). The second advantage of the spike anneal is the obvious advantage of much reduced thermal cycle due the rapid thermal anneal cycle. As a result, the halo dopant motion during rapid thermal annealing is much reduced.

A silicon oxide film with a thickness of between about 80 to 150 nm is then deposited on a top surface of the patterned substrate 1. If desired, a compound layer of $SiO_2$ and $Si_3N_4$ can be used as is known in the art. Through an ordinary etch back, side wall spacers 8a and 8b made of the silicon nitride film are formed, and exposed portions of the silicon oxide film 3 on the silicon substrate 1 are removed so as to expose the source and drain contact areas of silicon substrate 1 thereunder. Then, arsenic (As) ions are implanted into the substrate 1 at a dose of between about 5 to $10 \times 10^{15}$ cm$^2$ at about 50 KeV using the gate electrode 4 and the side wall spacers 8a and 8b as a mask, thereby forming an N$^+$-type deep source contact region 9a and an N$^+$-type deep drain contact region 9b.

As shown in FIG. 4, after depositing a cobalt (Co) film with a thickness of between about 5 to 8 nm on the top surface of the substrate 1 patterned as shown in FIG. 1, a heat treatment at a temperature of between about 600° to 850° C. is conducted to allow the Co film to react with the silicon substrate 1 and the polycrystalline silicon gate electrode 4, thereby respectively forming cobalt silicide films 10a, 10b and 10c ith a thickness of between about 20 to 30 nm. At this step, since the Co film does not react with the silicon oxide film, the Co films on the side wall spacers 8a and 8b remain unreacted. Then, the unreacted Co films are selectively removed by a wet etching.

As is also shown in FIG. 4, an interlevel insulating film 11, e.g., BPSG, is deposited in an ordinary manner and contact holes reaching the cobalt silicide films 10a and 10c are formed in the interlevel insulating film 11. Tungsten electrodes 12a and 12b are then formed in contact with the cobalt silicide films 10a and 10c.

A P-channel type MOS transistor can be produced in the same manner as above when the conductivity type of each region is reversed.

It will be appreciated that substrate 1 can also be of other group IV material, e.g., C, Ge, etc.; a group III–V material, e.g. GaAs, InP, AlGaAs, etc.; or a group II–VI material. Also for the P-type dopant B, In, Al and Ga can be used, while for the N-type dopant P, As, Sb can be used. For the conductors Al, Cu, Ti, Ni, heavily doped p-Si or a-Si, and combinations thereof can be used. Also a sacrificial sidewall process can be used as shown in said application Ser. No. 09/736,877. Further, the present invention can also be used in any device with a PN junction, e.g., diodes, bipolar transistors, etc. Still further other types of methods can be used to obtain interstitial traps, e.g., straining the Si crystal lattice such as by implanting ions, e.g., Ge, while methods other than using traps can be used to form a diffusion barrier, e.g. a thin insulating layer through which tunneling can occur.

The order of the steps can also be changed. For example, the shallow extension regions 5 can be implanted and then activated by spike or normal annealing. Then the halo regions 6 are implanted followed by the implanting of the barrier regions 7. Thereafter side wall spacers 8 are formed and followed by the deep implantation of source and drain regions 9. Next a spike or normal annealing is done to activate regions 6,7, and 9. The remaining steps of contact forming, etc. are as described above.

While the present invention has been particularly described with respect to preferred embodiments, it will be understood that the invention is not limited to these particular preferred embodiments, the process steps, the sequence, or the final structures depicted in the drawings. On the contrary, it is intended to cover all alternatives, modifications, and equivalents as may be included within the spirit and scope of the invention defined by the appended claims. In addition, other methods and/or devices may be employed in the method and apparatus of the instant invention as claimed with similar results.

What is claimed is:

1. An apparatus comprising:
   (a) a semiconductor substrate comprising at least one PN junction, at least one halo region disposed proximate said junction, and a channel region disposed proximate said halo region,
   (b) dopant atoms disposed within said semiconductor substrate at said PN junction, and
   (c) a diffusion barrier disposed between said halo and channel regions;
   wherein said diffusion barrier comprises interstitial traps of non-dopant atoms; and
   wherein said non-dopant atoms are selected from at least one of the group consisting of C, N, Si, and F.

2. The apparatus of claim 1, wherein said PN junction is an interface between two regions of said semiconductor substrate, and said PN junction is bordered, in one of said regions, by a layer of higher dopant concentration therein than elsewhere in said one of said regions.

3. The apparatus of claim 1, wherein said semiconductor comprises a field effect transistor including said junction and at least one additional junction.

4. A field effect transistor comprising:
   a) a semiconductor substrate comprising two PN junctions separated by a channel region therebetween;
   b) a source electrode disposed over one of the two PN junctions;
   c) a drain electrode disposed over the other of the two PN junctions;
   d) a dielectric layer disposed over said channel region;
   e) a gate electrode disposed over said dielectric layer;
   f) wherein both dopant atoms and non-dopant atoms are disposed within said semiconductor substrate at each of said two PN junctions;
   g) a pair of halo regions respectively disposed proximate said junctions;
   h) a pair of diffusion barriers respectively disposed between said halo and channel regions;
   wherein said diffusion barriers comprises interstitial traps of non-dopant atoms; and wherein said non-dopant atoms are selected from at least one of the group consisting of C, N, Si, and F.

5. A process comprising:

forming a semiconductor PN junction with dopant atoms thereat;

forming halo and channel regions; and forming a diffusion barrier between said halo and channel regions;

wherein said step of forming a barrier comprises forming interstitial traps of non-dopant atoms; and wherein said non-dopant atoms are selected from at least one of the group consisting of C, N, Si, and F.

6. The process of claim 5, wherein said PN junction is an interface between two regions of said semiconductor substrate, and said PN junction is bordered in one of said regions by a layer of higher dopant concentration therein than elsewhere in said one region.

7. The process of claim 5, further comprising spike annealing said semiconductor after introducing said non-dopant atoms at said PN junction.

8. The process of claim 7, wherein said annealing step comprises a fast temperature ramp up to a target temperature, a low hold time, and a fast temperature ramp down.

9. The process of claim 8, wherein said ramp up is greater than about 100° C./s, said target temperature is between about 800–1050° C., said hold time is about zero seconds, and said ramp down is greater than about 50° C./s.

10. The process of claim 5, further comprising spike annealing said semiconductor before introducing said non-dopant atoms at said PN junction.

* * * * *